United States Patent [19]

Skipor et al.

[11] Patent Number: 5,720,100

[45] Date of Patent: Feb. 24, 1998

[54] ASSEMBLY HAVING A FRAME EMBEDDED IN A POLYMERIC ENCAPSULANT AND METHOD FOR FORMING SAME

[75] Inventors: Andrew F. Skipor, Glendale Heights; Daniel Roman Gamota, Palatine; Chao-Pin Yeh, Schaumburg; Karl W. Wyatt, Cary, all of Ill.; Wen Xu Zhou, Atlanta, Ga.

[73] Assignee: Motorola, Inc., Schaumburg, Ill.

[21] Appl. No.: 581,695

[22] Filed: Dec. 29, 1995

[51] Int. Cl.$^6$ .................................................. H05K 3/34
[52] U.S. Cl. .................................................. 29/840
[58] Field of Search .................. 174/52.2, 52.3, 174/52.4; 156/307.01; 29/840, 841, 832, 827; 438/221–224, 125–127, 371, 379

[56] References Cited

U.S. PATENT DOCUMENTS

| 4,864,470 | 9/1989 | Nishio ........................ 174/52.2 |
| 5,120,678 | 6/1992 | Moore et al. |
| 5,218,234 | 6/1993 | Thompson et al. |
| 5,568,684 | 10/1996 | Wong ........................... 29/840 |

FOREIGN PATENT DOCUMENTS 63-239826  5/1988  Japan.

*Primary Examiner*—Carl E. Hall
*Assistant Examiner*—Christopher Goins
*Attorney, Agent, or Firm*—Douglas D. Fekete; John B. MacIntyre

[57] ABSTRACT

A microelectronic assembly (10) includes an integrated circuit die (12) that is mounted to a printed circuit board (14). The integrated circuit die (12) overlies the printed circuit board (14) and includes an active face (26) that faces the printed circuit board (14) and is spaced apart therefrom by a gap (30). A plurality of solder bump interconnections (32) extend across the gap (30) and connect a plurality of board bond pads (22) with a plurality of die bond pads (28). A polymeric precursor (13) is dispensed onto the printed circuit board (14) about the integrated circuit die (12) and is curable to form a polymeric encapsulant (16). The polymeric precursor (13) is drawn into the gap (30) and forms a fillet (34) overlying the printed circuit board (14). A frame (18) is embedded in the fillet (34) and the polymeric precursor (13) is heated to cure the polymeric precursor (13) to form a polymeric encapsulant (16). The frame (18) is affixed to the printed circuit board (14) within the polymeric encapsulant (16) to provide increased mechanical strength for the microelectronic assembly (10).

12 Claims, 1 Drawing Sheet

ASSEMBLY HAVING A FRAME EMBEDDED IN A POLYMERIC ENCAPSULANT AND METHOD FOR FORMING SAME

FIELD OF THE INVENTION

This invention relates generally to a microelectronic assembly in which an integrated circuit die is spaced apart from a printed circuit board by a gap that is filled with a polymeric encapsulant. More particularly, this invention relates to such a microelectronic assembly that includes a frame embedded in the encapsulant to enhance the strength of the microelectronic assembly.

BACKGROUND OF THE INVENTION

It is known to mount an integrated circuit die to a printed circuit board by solder bump interconnections. The integrated circuit die is spaced apart from the printed circuit board by a gap. The solder bump interconnections extend across the gap and connect bond pads on the integrated circuit die to bond pads on printed circuit boards to attach the die and conduct electrical signals to and from the die for processing. Because of differences between the coefficients of thermal expansion of the die and the board, stresses are created when the assembly is subjected to thermal cycling during use. These stresses tend to fatigue the solder bump interconnections and can lead to failure of the assembly. In order to strengthen the solder joints without affecting the electrical connection, the gap is filled with a polymeric encapsulant, typically a filled polymer.

The encapsulant is typically applied after the solder bumps are reflowed to bond the integrated circuit die to the printed circuit board. A polymeric precursor is dispensed onto the board adjacent to the die and is drawn into the gap by capillary action. The precursor is then heated and cured to form the encapsulant. This curing can also create stresses that can be detrimental to the die and the interconnections.

Therefore, a need exists to reduce the detrimental effects of thermally induced stresses upon a microelectronic assembly wherein the integrated circuit die is attached to the printed circuit board by solder bump interconnections and encapsulated within a polymeric material, and to thereby extend the useful life of the assembly.

DETAILED DESCRIPTION OF A PREFERRED EMBODIMENT

The present invention provides a microelectronic assembly in which an integrated circuit die is spaced apart from a printed circuit board by a gap and is attached by solder bump interconnections that extend across the gap and connect bond pads on the die to bond pads on the board. The gap is filled with a polymeric encapsulant that extends over the printed circuit board about the perimeter of the die. In accordance with this invention, a frame, preferably formed of a ceramic material, is embedded in the encapsulant about the die. The frame is embedded prior to curing the encapsulant. During manufacture of the assembly, after the solder bump interconnections have been formed to attach the die, a polymeric precursor is dispensed onto the printed circuit board about the integrated circuit die and is drawn into the gap by capillary action to form a fillet that extends over the printed circuit board about the die. The frame is then embedded into the fillet, after which the polymeric precursor is cured to form the encapsulant. During curing, the frame constrains the printed circuit board by constraining the encapsulant to reduce the effect of stresses that might otherwise damage the die and the interconnections. Moreover, curing affixes the frame to the board, so that the frame becomes an integral part of the assembly. Thereafter, when the assembly is subjected to thermal cycling during use, the frame provides enhanced mechanical strength by locally constraining the printed circuit board and the encapsulant to reduce the effects of thermally induced stresses upon the assembly, thereby improving the useful life of the assembly.

Figure 1:
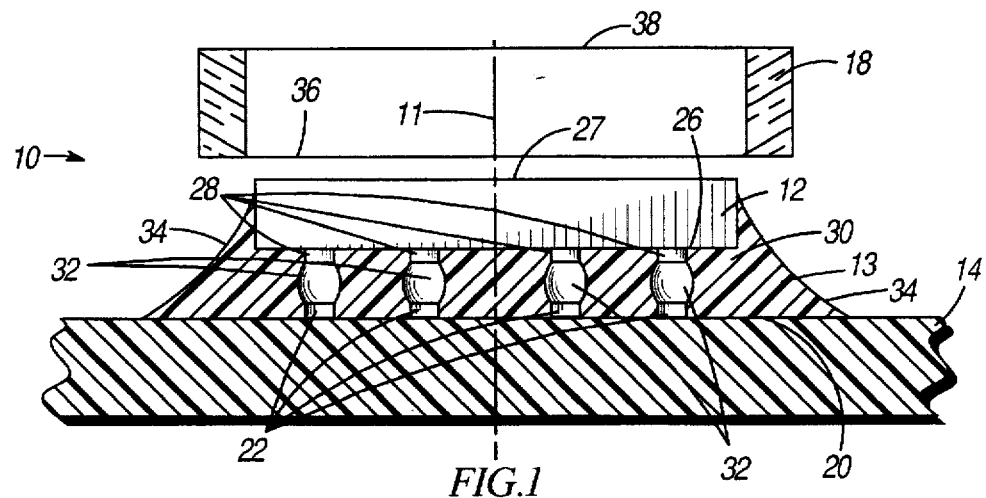
FIG. 1 is a cross-sectional view of a microelectronic assembly prior to embedding a frame in a polymeric precursor in accordance with a preferred embodiment of the present invention.
Figure 2:
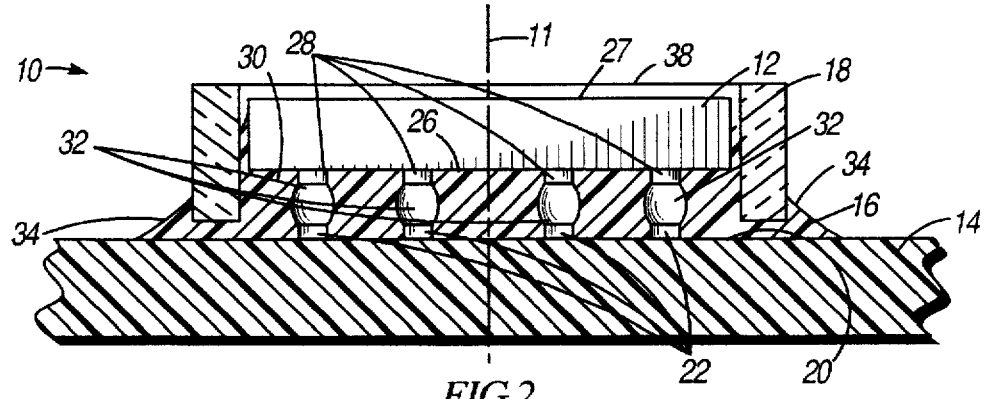
FIG. 2 is a cross-sectional view of the microelectronic assembly of FIG. 1 subsequent to embedding the frame in the polymeric precursor.
Figure 3:
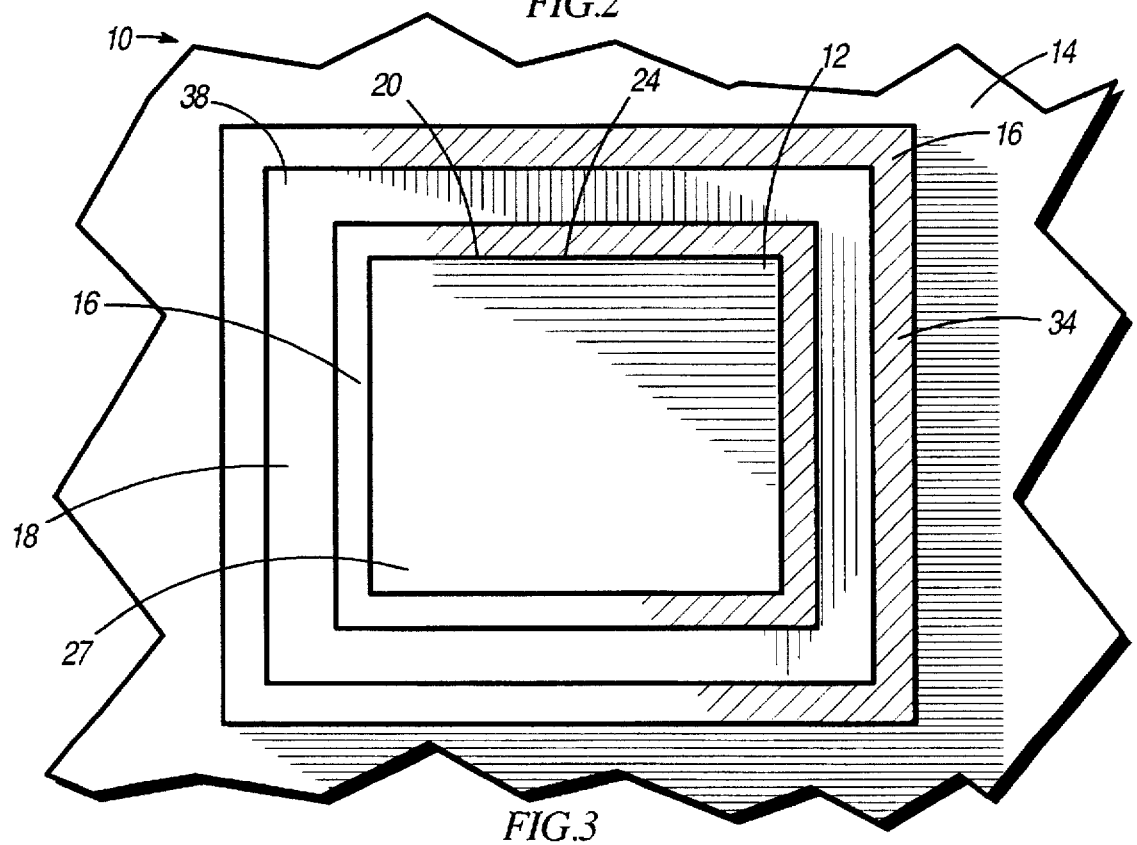
FIG. 3 is a top plan view of the microelectronic assembly of FIG. 2.

A preferred embodiment of the present invention can be better understood with reference to FIGS. 1 through 3. Integrated circuit die 12 is preferably formed of silicon and has a coefficient of thermal expansion between about 2 and 3 ppm/°C. Die 12 comprises an active face 26 and a non-active face 27, which are planar and perpendicular to axis 11. A plurality of bond pads 28 are disposed on active face 26. Die 12 is mounted to printed circuit board 14 through a plurality of solder bump interconnections 32 that are effective in electrically and mechanically connecting die bond pads 28 with board bond pads 22, located at die attach region 20. Printed circuit board 14 is preferably formed of a glass-epoxy laminate that has a coefficient of thermal expansion of between about 15 and 22 ppm/°C. Board bond pads 22 are preferably composed of solder-wettable copper. Die bond pads 28 are disposed on active face 26 of integrated circuit die 12 and are composed of a solder-wettable metal.

To form the interconnections, solder bumps are applied to pads 22. A preferred solder is composed of eutectic tin-lead alloy comprising about 63 weight percent tin and the balance substantially lead and having a melting temperature of about 183° C. Solder bumps are also applied to pads 28 and are formed of tin-lead solder comprising about 97 weight percent lead and the balance substantially tin and having a melting temperature substantially higher than the melting temperature of the eutectic tin-lead solder. Integrated circuit die 12 is arranged on printed circuit board 14 such that each of the board bond pads 22 registers with a die bond pad 28, with the solder bumps therebetween. A flux is applied to the solder bumps to enhance wetting during reflow. The arrangement is heated to a temperature sufficient to reflow the eutectic solder. In a preferred embodiment, assembly 10 is reflowed at a temperature above 183° C. and less than 220° C. Thereafter the arrangement is cooled to form solder bump interconnections 32.

The resulting structure includes a gap 30 between active face 26 and printed circuit board 14. By way of an example, gap 30 is preferably between about 25 and 150 microns. In order to strengthen solder bump interconnections 32, integrated circuit die 12 is underfilled with a polymeric encapsulant 16. To form the encapsulant, a polymeric precursor 13 is dispensed onto printed circuit board 14 adjacent to die perimeter 24. Polymeric precursor 13 is formed of a thermally- or radiation-curable material and is preferably composed of an anhydride-hardened prepolymer material, such as an epoxy resin, utilizing an amine compound catalyst and containing a filler, preferably silica or alumina. A suitable epoxy material is Dexter Hysol FP4510 made by The Dexter Corporation. Precursor 13 is preferably dispensed onto printed circuit board 14 using a syringe and is applied in a bead along perimeter 24 of integrated circuit die 12. Preferably, printed circuit board 14 is preheated to a temperature, preferably above about 75° C., to lower the viscosity of polymeric precursor 13. The precursor is then drawn into gap 30 by capillary action and forms a fillet 34 that extends onto the printed circuit board about die 12.

In accordance with this invention, a frame 18, preferably composed of a ceramic material such as alumina and having a coefficient of thermal expansion between about 4 and 8 ppm/°C., is axially lowered and embedded into fillet 34 about die 12. Frame 18 comprises a bottom surface 36 facing printed circuit board 14 and a top surface 38 opposite bottom surface 36. Frame 18 is embedded so that bottom surface 36 is proximate to printed circuit board 14, with the spacing therebetween being preferably less than about 25 microns. After placement, top surface 38 is spaced apart from printed circuit board 14 by a first height, whereas non-active face 27 is spaced apart from printed circuit board 14 by a second height, which, in this embodiment, is less than the first height. In this manner, frame 18 extends above die 12 and provides protection for die 12 against damage from contact during subsequent manufacture or use.

Frame 18 is spaced apart from die perimeter 24 by a distance not greater than about 250 microns, and preferably by a distance not greater than about 100 microns. One advantage of the method of this invention wherein the precursor for the encapsulant is dispensed prior to positioning the frame is that the frame is preferably sized to fit proximal about the die with minimal clearance. Also, keeping frame 18 proximate to die perimeter 24 enhances the effectiveness of the frame to constrain die attach region 20 of printed circuit board 14, and thus increases the mechanical strength provided by the frame to the assembly.

After frame 18 is embedded in fillet 34, printed circuit board 14 is heated to cure precursor 13 and form encapsulant 16. By way of an example, precursor 13 is cured by heating to a temperature greater than about 125° C., preferably to between about 125° and 175° C. Encapsulant 16 surrounds solder bump interconnections 32 and improves the reliability of integrated circuit die 12 mounted on printed circuit board 14. The resulting encapsulant typically exhibits a coefficient of thermal expansion between about 20 and 30 ppm/°C., significantly greater than die 12. During curing, frame 12 constrains the encapsulant to reduce the effects of stresses during the reaction of the precursor, and after curing, frame 12 constrains the encapsulant and printed circuit board 14 to reduce the effects of stresses generated during cool down to ambient conditions, which stresses might otherwise damage the die and the interconnections bonded thereto. Concurrently, frame 18 becomes affixed within encapsulant 16 to form an integral part of the product assembly 10.

The resulting microelectronic assembly 10 thus comprises integrated circuit die 12 spaced apart from printed circuit board 14 by gap 30 and mounted thereto by a plurality of solder bump interconnections 32. Gap 30 is filled by polymeric encapsulant 16, which extends over the board about the die perimeter 24. In accordance with this invention, frame 18 is embedded in the encapsulant about die 12 and thereby attached to printed circuit board 14. The frame provides increased mechanical strength for the assembly. This is attributed to the ability of the frame to constrain the encapsulant and the printed circuit board at the die attach region and thereby reduce the effect of thermally induced stresses upon the solder bump interconnections as a result of differences between the expansion and contraction of the various materials during thermal cycling. This reduces fatiguing of the solder bump interconnections, which would otherwise lead to failure of the interconnections. Thus the frame increases the useful life of the microelectronic assembly. In the preferred embodiment, the frame also extends above the die to protect the die from damage caused by contact during manufacture or use on the non-active face.

While this invention has been described in terms of certain examples thereof, it is not intended that it be limited to the above description, but rather only to the extent set forth in the claims that follow.

The embodiments of this invention in which an exclusive property or privilege is claimed are defined as follows:

1. A method for forming a microelectronic assembly, the method comprising:

mounting an integrated circuit die onto a printed circuit board spaced apart from the integrated circuit die by a gap and connected thereto by a plurality of solder bump interconnections that extend across the gap;

dispensing a polymeric precursor onto the printed circuit board adjacent to the integrated circuit die;

drawing the polymeric precursor into the gap and forming a fillet that extends over the printed circuit board about the integrated circuit die; and then embedding a frame in the fillet such that the frame is disposed about the integrated circuit die; and curing the polymeric precursor to form a polymeric encapsulant that encapsulates the solder bump interconnections within the gap and affixes the frame to the printed circuit board.

2. A method for forming a microelectronic assembly in accordance with claim 1, further comprising, prior to the step of dispensing, the step of preheating the printed circuit board to a temperature sufficient to reduce the viscosity of the polymeric precursor.

3. A method for forming a microelectronic assembly in accordance with claim 1, wherein the step of drawing the polymeric precursor into the gap comprises drawing the polymeric precursor into the gap by capillary action.

4. A method for forming a microelectronic assembly in accordance with claim 1, wherein the step of dispensing a polymeric precursor comprises putting down a bead of polymeric precursor along a perimeter of the integrated circuit die.

5. A method for forming a microelectronic assembly in accordance with claim 1, wherein the step of curing the polymeric precursor comprises heating the polymeric precursor to a temperature greater than about 125° C.

6. A method for forming a microelectronic assembly in accordance with claim 1, wherein the frame is formed of a ceramic material.

7. A method for forming a microelectronic assembly in accordance with claim 1, wherein the frame comprises a bottom surface facing the printed circuit board and a top surface opposite the bottom surface, wherein the top surface is spaced from the printed circuit board by a first height, and wherein the integrated circuit die further comprises a face opposite the printed circuit board and spaced apart therefrom by a second height, and wherein the step of embedding a frame includes embedding the frame such that the first height is greater than the second height.

8. A method for forming a microelectronic assembly in accordance with claim 1, wherein the integrated circuit die further comprises a perimeter, and wherein the frame is spaced apart from the perimeter by a distance not greater than about 250 microns.

9. A method for forming a microelectronic assembly, the method comprising:

mounting an integrated circuit die onto a printed circuit board, the printed circuit board including a die attach region and a plurality of bond pads disposed at the die attach region, the integrated circuit die including a die perimeter, an active face facing the substrate and spaced apart therefrom by a gap, and a plurality of bond pads disposed on the active face in a pattern such that each of the plurality of bond pads registers with and is connected to a bond pad on the printed circuit board by a plurality of solder bump interconnections;

dispensing a polymeric precursor onto the printed circuit board about the die attach region;

drawing the polymeric precursor into the gap to form a fillet that extends over the printed circuit board about the die and then perimeter;

embedding a ceramic frame in the fillet; and heating the polymeric precursor to a temperature effective to cure the polymeric precursor to form a polymeric encapsulant to affix the frame to the printed circuit board within the fillet.

10. A method for forming a microelectronic assembly in accordance with claim 9, wherein the step of heating the polymeric precursor comprises heating the polymeric precursor to a temperature greater than about 125° C.

11. A method for forming a microelectronic assembly in accordance with claim 9, wherein the ceramic frame is formed of alumina.

12. A method for forming a microelectronic assembly in accordance with claim 9, wherein the frame is spaced apart from the printed circuit board by less than about 25 microns.

* * * * *